United States Patent [19]

Welles

[11] 4,415,856
[45] Nov. 15, 1983

[54] ROTATABLE MAGNETIC FIELD-SENSING SOLID-STATE SWITCH APPARATUS

[75] Inventor: Kenneth B. Welles, Schenectady, N.Y.

[73] Assignee: General Electric Company, Schenectady, N.Y.

[21] Appl. No.: 225,885

[22] Filed: Jan. 19, 1981

[51] Int. Cl.³ .................... G01B 7/14; H01L 43/08
[52] U.S. Cl. .................................... 324/208; 338/32 H
[58] Field of Search ............... 324/207, 208, 173, 174; 338/32 R, 32 H

[56] References Cited

U.S. PATENT DOCUMENTS 3,988,710 10/1976 Sidor et al. ................... 338/32 R
4,054,860 10/1977 Henderson et al. ........... 338/32 H
4,283,679 11/1981 Ito et al. ........................ 324/208

Primary Examiner—Gerard R. Strecker
Assistant Examiner—Walter E. Snow
Attorney, Agent, or Firm—Geoffrey H. Krauss; James C. Davis, Jr.; Marvin Snyder

[57] ABSTRACT

A manually-operated rotary switch apparatus utilizes a rotatable magnet for establishing the dual-polarity outputs of each of a pair of magnetic field sensors, oriented substantially perpendicular to each other. The dual-polarity voltages are processed to approximate the arc tangent of the angle of the knob-rotatable magnetic member, with respect to a reference orientation, to provide digital data output related to the switch position of the manually-rotatable knob.

9 Claims, 3 Drawing Figures

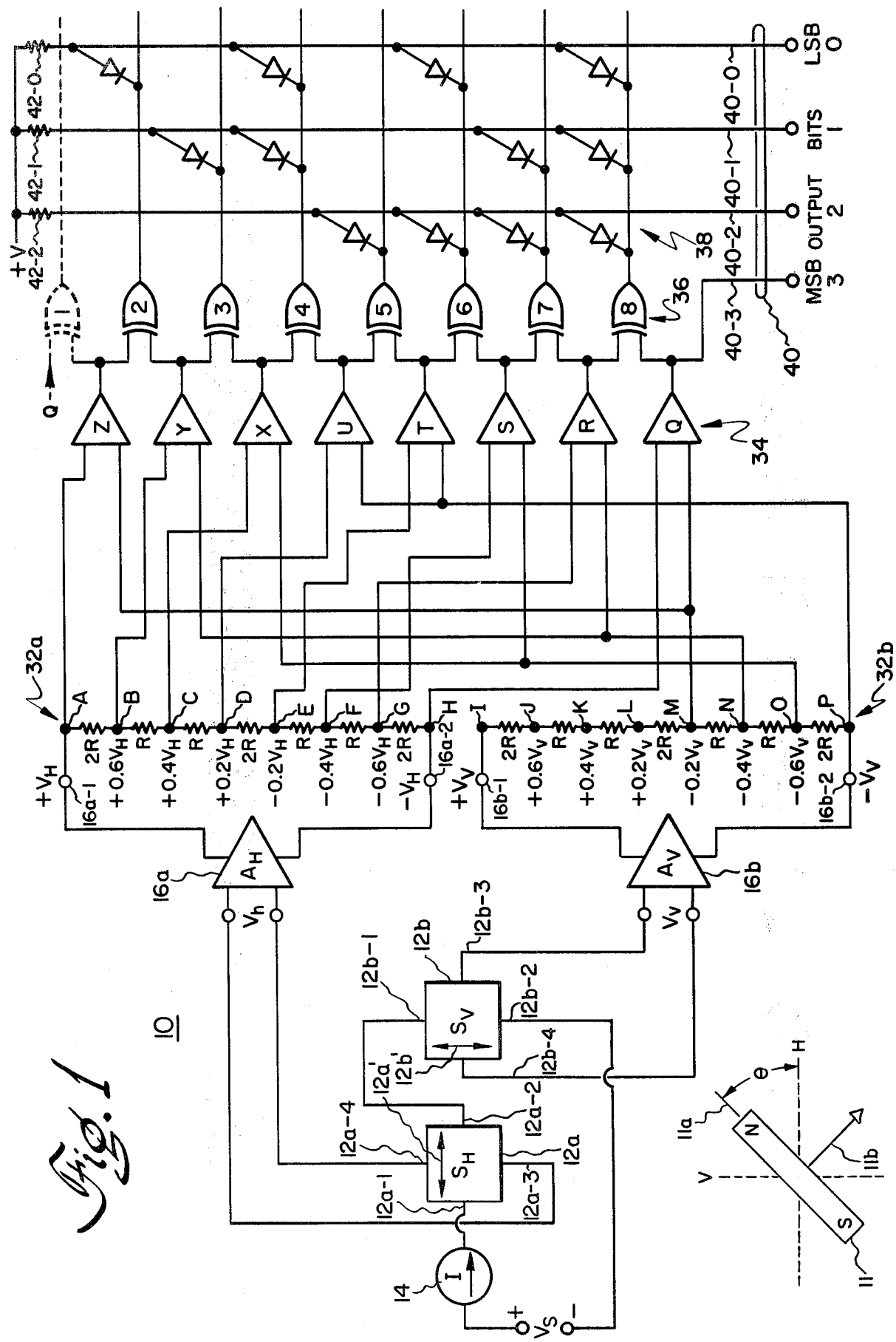

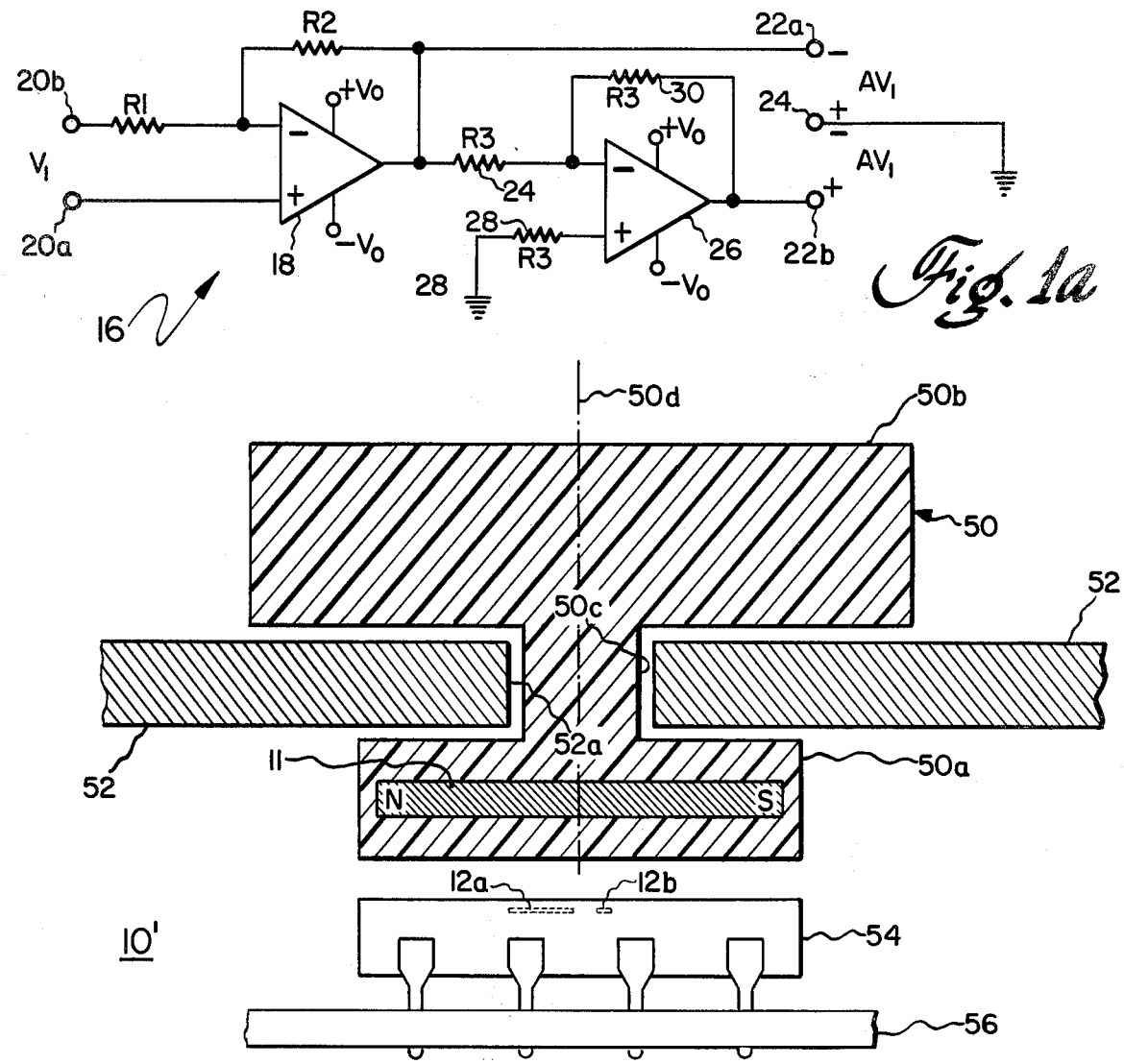

ROTATABLE MAGNETIC FIELD-SENSING SOLID-STATE SWITCH APPARATUS

BACKGROUND OF THE INVENTION

The present invention relates to rotary switch apparatus and, more particularly, to a novel solid-state rotary switch utilizing sensing of the perpendicular field components of a rotatable magnetic member.

Mechanical rotary switches are well-known. Typical multi-position rotary switches of the unsealed type are easily contaminated. Contamination may be avoided, and reliability significantly improved, if the mechanical rotary switch is of a totally sealed construction. However, such totally-sealed mechanical rotary switches are typically both bulky and expensive. Either type of mechanical-contact rotary switch also requires many assembly operations, as multiple metal, plastic and/or ceramic parts are required for the construction thereof. The labor content and/or number of different machine-assembly operations is therefore quite high.

Optically-encoded rotary switches have been built to overcome some of the disadvantages of the mechanical-contact rotary switch, but also require a relatively large number of parts, including several pairs of individual light-emitting diode sources and photosensor detectors. The several parts of an optoelectronics rotary switch require careful assembly alignment for proper operation of the encoding switch unit.

It is therefore highly desirable to provide a rotary switch which is not only of low cost, but also of high reliability. It is desirable that the number of moving parts be reduced to a bare minimum and that automatic construction, including component insertion techniques already in existence, be utilizable to minimize switch assembly cost.

BRIEF SUMMARY OF THE INVENTION

In accordance with the invention, a solid-state rotary switch utilizes a magnetic member contained in a rotatable knob, with the magnet mounted above a pair of magnetic field sensors having the sensor axes established substantially perpendicular to each other. The sensors provide a pair of output voltages of magnitude related to the arc tangent of the angle formed by the magnetic member axis, with respect to a reference line. The substantially-perpendicular-field-component voltages are converted into a digital signal indicative of that one of a plurality of positions of the magnetic member, with respect to the reference position, to provide digital switch position output data.

In one presently preferred embodiment, an array of comparators and exclusive-OR gates are utilized with a diode matrix to provide binary-coded position data, typically resolving the magnetic member to one of 16 preselected rotational positions.

Accordingly, it is an object of the present invention to provide a novel solid-state rotary switch apparatus having a single moving part.

This and other objects of the present invention will become apparent upon consideration of the following detailed description when read in conjunction with the drawings.

BRIEF DESCRIPTION OF THE DRAWINGS

FIG. 1 is a schematic block diagram of a presently preferred embodiment of the novel solid-state rotary switch apparatus of the present invention;

FIG. 1a is a schematic diagram of a dual-polarity differential input/output amplifier for use in the apparatus of FIG. 1; and FIG. 2 is a partially-sectioned sideview of a presently preferred physical configuration for the novel solid-state rotary switch apparatus, in accordance with the principles of the present invention.

DETAILED DESCRIPTION OF THE INVENTION

Referring now to FIGS. 1 and 1a, my novel solid-state rotary switch apparatus 10 utilizes a magnetic member 11, such as an elongated bar permanent magnet and the like, positioned above a pair of magnetic field sensing means 12a and 12b having their respective magnetic field-sensing axes 12a' and 12b' aligned in substantially perpendicular directions to one another. Illustratively, sensors 12a and 12b are Hall-effect sensors, each having a pair of terminals 12a-1, 12a-2 and 12b-1, 12b-2 for allowing flow of an excitation current I therethrough, and having an additional pair of terminals 12a-3, 12a-4 and 12b-3, 12b-4, across which appear a voltage proportional to the strength of the magnetic field, of member 11, along the magnetic-sensing-axis of the particular sensor, multiplied by the sensor excitation current I. The same excitation current is caused to flow through both sensors 12a and 12b, from a current source 14, connected to a source of operating potential $V_s$. Since the same excitation current is utilized in both Hall-effect sensors, and as the sensors are relatively small and placed close together relative to the impinging magnetic field, the angle $\theta$ of the magnetic member 10, relative to a reference line, herein the horizontal H axis, is very closely approximated by the arc tangent of the vertical signal magnitude $V_v$ (appearing between sensor output leads 12b-3 and 12b-4) divided by the horizontal sensor output voltage magnitude $V_h$ (appearing between horizontal sensor output terminals 12a-3 and 12a-4). Thus, the switch position angle $\theta$ may be found by dividing the vertical signal magnitude by the horizontal signal magnitude and processing the quotient to obtain the arc tangent thereof.

One presently preferred embodiment for converting the magnitude of the analog horizontal and vertical sensor output voltage magnitudes $V_h$ and $V_v$ to digital position indication data utilizes a differential-input, differential-output dual-polarity operational amplifier circuit 16a or 16b, to respectively scale each of the horizontal and vertical sensor output voltages. Each of the two differential inputs of each amplifier 16 is connected to an associated one of the two outputs of the associated sensor, e.g. the horizontal field voltage amplifier 16a has one input connected to horizontal sensor output 12a-3 and the other input connected to horizontal sensor 12a-4, while vertical sensor voltage amplifier 16b has one input connected to vertical sensor output lead 12b-3 and the other input connected to vertical sensor output 12b-4.

Each of amplifiers 16 may be configured as shown in FIG. 1a, wherein a first operational amplifier 18 (such as the standard 741 integrated circuit operational amplifier) has the non-inverting input thereof connected to one input terminal 20a, and the inverting input thereof connected through a first resistance element $R_1$ to a second input terminal 20b. A feedback resistance $R_2$ is connected between the first operational amplifier input and output, and is of a magnitude selected to obtain, in conjunction with the magnitude of resistance $R_1$, the gain $A_H$ or $A_V$ of the particular amplifier 16a or 16b. The first operational amplifier 18 output is connected to a first output terminal 22a of the amplifier 16. The first operational amplifier output is also connected through a resistance element 24 to the inverting input of another operational amplifier 26. A resistance element 28 is connected between the non-inverting input of amplifier 26 and ground potential. A feedback resistance element 30 is connected between the inverting input and output of amplifier 26 (which may also be of the 741 type). The output of amplifier 26 is connected to a second amplifier circuit output terminal 22b. With both operational amplifiers connected to sources of operating potential of substantially equal amplitudes and opposite polarity ($\pm V_o$) and with the resistance magnitude $R_3$ of each of resistances 24, 28 and 30 being equal to the parallel-equivalent resistance of resistance element $R_2$ in parallel with resistance element $R_1$, and with the magnitude of resistance elements $R_2$ and $R_1$ being selected to achieve a desired amplifier gain A, the output voltages at each of output terminals 22a and 22b, with respect to a common ground terminal 32, will be of opposite polarity and of magnitude $AV_1$, where $V_1$ is the input voltage between input terminals 20a and 20b.

Thus, the amplified horizontal sensor output voltage appears between horizontal terminals 16a-1 and 16a-2, with positive polarity and magnitude $V_H$ ($=A_H\times V_h$) and with positive polarity at terminal 16a-1 and negative polarity at terminal 16a-2. Similarly, the amplified vertical sensor output voltage appears with magnitude $V_V$ ($=A_V\times V_v$) and with positive polarity at terminal 16b-1 and negative polarity at terminal 16b-2.

Connected between terminals 16a-1 and 16a-2, and between terminals 16b-1 and 16b-2, is one of a pair of series-connected resistance element chains 32a or 32b. Each chain is substantially identical and symmetrical, having seven resistance elements; the first, fourth, and seventh elements are of equal value and twice the resistance value of the equally-valued second, third, fifth and sixth resistance elements. Thus, at junction A (connected to terminal 16a-1) a signal of polarity and magnitude $+V_H$ appears. The signal at sequential terminals B, C and D are of positive polarity and decreasing magnitude, e.g. the voltage at point B is $+0.6\ V_H$, at point C the voltage is $+0.4\ V_H$ and at terminal D the voltage is $+0.2\ V_H$. Similarly, the voltages at terminals E-H are of negative polarity and of increasing magnitudes of the amplified horizontal sensor voltage, e.g. at terminal E the voltage is $-0.2\ V_H$, at terminal F the voltage is $-0.4\ V_H$, at terminal G the voltage is $-0.6\ V_H$ and at terminal H (connected to terminal 16a-2) the voltage is $-V_H$. The voltages at terminals I-P are of similar polarity and magnitude percentage, but are of the amplified vertical voltage $V_V$, as the polarities and percentages of the amplified horizontal voltages at terminals A-H. Thus, the voltage at terminal I (connected to terminal 16b-1) is $+V_V$ while at the voltage at terminal P (connected to terminal 16b-2) is $-V_V$, with the intermediate terminal J-O voltages being respectively equal to $+0.6\ V_V$, $+0.4\ V_V$, $+0.2\ V_V$, $-0.2\ V_V$, $-0.4\ V_V$ and $-0.6\ V_V$. It should be understood that the number and magnitude of resistance elements in each of the chains has been selected to provide preselected amplitude signals at terminals A-P for distinguishing 1 of 16 substantially equal angular positions of magnetic member 11; greater or lesser number of resistance elements in each chain, and different relationships of the value of elements in a particular chain, may be utilized in circuitry distinguishing greater or lesser number of angular segments of a circular rotation.

A plurality of comparators 34 are each utilized to discern half of $2\pi$ radians of magnetic field rotation, starting at a fixed angle. Thus, in the illustrative 16 switch-position system, 8 comparators, respectively labeled Q, R, S, T, U, X, Y and Z, are utilized. One input of each comparator receives one of the amplified horizontal sensor analog voltages, from one of terminals A-H, while the other comparator input receives one of the negative-polarity amplified vertical sensor output voltages from associated one of terminals M-P. For example, comparator Q compares $-V_H$ to $-0.2\ V_V$, by connection of the comparator Q inputs respectively to terminal H and terminal M. The output of comparator Q is a logic true signal whenever the vertical field magnitude (represented by the magnitude of voltage $V_V$) is more than five times the horizontal field magnitude (as represented by the horizontal voltage $V_H$); the comparator Q output is a logic false signal at any other time. Thus, the comparator Q output is a logic true signal for a magnetic field angle between $7\pi/16$ and $23\pi/16$ in the Cartesian system, and is a logic false signal for all magnetic field angles between 0 and $7\pi/16$ or between $23\pi/16$ and $2\pi$. The connection points, comparison voltages and logic true ranges for each of comparators Q-Z are listed in Table 1.

TABLE 1

| Comparator | Connection Points | Compares | Output Logic True Range From | To |
|---|---|---|---|---|
| Q | H and M | $-1.0V_H$ to $-0.2V_V$ | $7\pi/16$ | $23\pi/16$ |
| R | G and N | $-0.6V_H$ to $-0.4V_V$ | $5\pi/16$ | $21\pi/16$ |
| S | F and O | $-0.4V_H$ to $-0.6V_V$ | $3\pi/16$ | $19\pi/16$ |
| T | E and P | $-0.2V_H$ to $-1.0V_V$ | $1\pi/16$ | $17\pi/16$ |
| U | D and P | $+0.2V_H$ to $-1.0V_V$ | $31\pi/16$ | $15\pi/16$ |
| X | C and O | $+0.4V_H$ to $-0.6V_V$ | $29\pi/16$ | $13\pi/16$ |
| Y | B and N | $+0.6V_H$ to $-0.4V_V$ | $27\pi/16$ | $11\pi/16$ |
| Z | A and M | $+1.0V_H$ to $-0.2V_V$ | $25\pi/16$ | $9\pi/16$ |

It will be noted that the state of the logic signal, detecting which half of the circle the magnetic field angle is in, is independent of the excitation current I or the field strength of magnetic member 11. It will also be noted that the output logic true range of data of each comparator changes state at one of the dividing lines between adjacent ones of the 16 possible positions, assuming that the reference line and one of the positions are aligned at an arbitrarily assigned 0° angle reference. Thus, by selection of the appropriate pair of comparator outputs, that one of the 16 angular rotation positions at which magnetic member 11 is then situated can be obtained.

The conversion of the comparator output signals to a digitally-encoded magnetic member position signal is carried out by means of a plurality of exclusive-OR-gates 36 and a diode matrix 38. In the illustrated example, the 16 possible magnetic member positions may be resolved in an associated four-bit digital output signal. Therefore, a four-bit-wide digital output bus 40 is utilized, having at least-significant-bit (LSB) bit zero line 40-0, a most-significant-bit (MSB) bit three line 40-3 and intermediate bit 1 and bit 2 lines 40-1 and 40-2. Each of bit output lines 40-0, 40-1 and 40-2 are connected through an associated one of pull-up resistors 42-0, 42-1 and 42-2 to a source of positive-polarity potential (+V) which may be the same operating potential utilized for comparators 44 and gates 36.

The number of comparators 34 is equal to M, where the number of resolvable magnetic member positions $p=2$ M. Similarly, a total of M exclusive-OR gates 36 may be required. Each of the two-input exclusive-OR gates 1–8 receive two adjacent comparator outputs. Thus, gate 1 receives the Q and Z comparator outputs while gate 2 receives the Z and Y comparator outputs. Gate 3 receives the X and Y comparator outputs, gate 4 receives the U and X comparator outputs, gate 5 receives the U and T comparator outputs and gate 6 receives the T and S comparator outputs, while gate 7 receives the R and S comparator outputs and gate 8 receives the R and Q outputs. The output of each of gates 36 is connected through appropriate ones of the diodes of array 38, to provide the required four bit encoded output data. A diode of array 38, when used, has the anode thereof connected to the appropriate one of output lines 40-1 to 40-2 and the cathode connected to the appropriate output of gates 1–8. Thus, in a negative logic system with a logic zero being represented by a bit level of +V and a logic 1 being represented by substantially lesser magnitude voltage, gate 2 provides a high voltage (logic 0) output if the Y and Z comparator outputs are both high, or are both low. If the Z output is high and the Y output is low (corresponding to an angle between 25 $\pi/16$ and 2 $\pi/16$) or if the Z output is low and the Y output is high (corresponding to an angle between 9 $\pi/16$ and 11 $\pi/16$) then gate 2 provides a low output voltage (a logic 1 level). Similarly, each of the other gate outputs will yield two diametrically-opposed switch position sets of data on lines 40-0, 40-1 and 40-2, as $\theta$ traverses through the 16 positions on a circle of rotation. Accordingly, the rotational ambiguity is resolved by connecting the MSB bit 3 line 40-3 to the Q comparator output, which line 40-3 will be at a high (logic 0) state if the angle $\theta$ between the magnetic number and the horizontal positive axis is between 7 $\pi/16$ radians to the 23 $\pi/16$ radians, corresponding to the eight switch setting positions at $\theta = N\,\pi/16$, where N equals 8, 10, 12, 14, 16, 18, 20 and 22. The diodes of matrix 38 establish the 8 positions for each half of the 16 settable positions. It will be noted that the output of gate 1 is not connected to any of the bit zero, 1 or 2 lines 40-0, 40-1 or 40-2, and therefore gate 1 is not absolutely required. Gate 1 is shown for illustration of the symmetry of the decoding logic, and in practical cases, wherein integrated circuitry might be used for providing gates 36, a typical integrated circuit package will contain four exclusive-OR gates, whereby two packages are required to provide the seven necessary gates 2–8, and the eighth gate is available if the use thereof is desired. The output bit patterns for the 16 settable positions are listed in Table II.

TABLE II

| Switch Position $\ominus = 2N\,\pi/16$ | MSB BIT 3 | OUTPUT BIT 2 | DATA BIT 1 | LSB BIT0 |
|---|---|---|---|---|
| N = 1 | 1 | 1 | 0 | 1 |
| 2 | 1 | 1 | 1 | 0 |
| 3 | 1 | 1 | 1 | 1 |
| 4 | 0 | 0 | 0 | 0 |
| 5 | 0 | 0 | 0 | 1 |
| 6 | 0 | 0 | 1 | 0 |
| 7 | 0 | 0 | 1 | 1 |
| 8 | 0 | 1 | 0 | 0 |
| 9 | 0 | 1 | 0 | 1 |
| 10 | 0 | 1 | 1 | 0 |
| 11 | 0 | 1 | 1 | 1 |
| 12 | 1 | 0 | 0 | 0 |
| 13 | 1 | 0 | 0 | 1 |
| 14 | 1 | 0 | 1 | 0 |
| 15 | 1 | 0 | 1 | 1 |
| 16 | 1 | 1 | 0 | 0 |

The 90° offset shown in Table II may be accomodated by subsequent data transformations, or may be accomodated by placing a control knob index 11b at a position rotated 90°, in the proper direction, from axis 11a passing through magnetic number 11 and at the North Pole thereof (see FIG. 1).

Referring now to FIG. 2, magnetic member 11 may be embedded in an extension portion 50a of a rotary control knob 50, formed of a non-magnetic material, such as plastic and the like. Portion 50a is positioned behind a bushing panel portion 52, while a knob portion 50b is positioned adjacent the opposite surface of panel 52, with a shared portion 52 extending between portions 50a and 50b and passing through an aperture 52a in the panel. Advantageously, the entire circuitry of FIG. 1 may be integrated onto a single integrated circuit, with the crossed-axes magnetic field sensors 12a and 12b thereof positioned below, and substantially on the axis of rotation 50d of, knob 50. The integrated circuit may be placed in a package 54 of type well-known to the art, with an 8-pin dual-in-line package (DIP) being utilized for the illustrated 16 position switch apparatus. The integrated circuit package is thus capable of being fabricated in a relatively low cost manner, with a high degree of automation, and can be automatically inserted in a printed circuit board 56 for positioning of the chip below the member 11 axis of rotation, whereby a low-cost and high-reliability solid-state rotary switch apparatus 10' may be provided.

While my present invention has been described with respect to a presently preferred embodiment thereof, many modifications and variations will now become apparent to those skilled in the art. It is my intent, therefore, to be limited only by the scope of the appending claim and not by the specific details and instrumentalities described herein.

What is claimed is:
1. A solid-state rotary switch apparatus, comprising:
   a magnetic member rotatable in a plane;
   first and second magnetic field sensors each having a sensor axis disposed substantially perpendicular to one another and in another plane adjacent to the plane of magnetic member rotation; each sensor providing an output signal of magnitude proportional to the angle of said magnetic member with respect to the sensor axis thereof; and
   means responsive to the outputs of said sensors for providing digital data indicating that one of a preselected plurality P of angular rotational positions of said magnetic member, with respect to a rotational reference, to which a selected pole of said member is presently rotated, said digital data providing means including: first and second differential-input, differential-output amplifiers each receiving the output signal of one of said sensors; a resistance element chain connected between the differential outputs of each of said amplifiers; a plurality of two-input comparators, the inputs of each comparator being connected to terminals of said resistance chain in preselected manner to cause each comparator output to be enabled when said selected pole of said magnetic member is at different ones of $\pi$ radians of rotation from said reference line; a plurality of two-input exclusive-OR-gates, each gate having each input thereof connected to a different one of two adjacent ones of said comparators for enabling a gate output only when said magnetic member is positioned at diametrically-opposed different ones of the plurality of possible rotational positions of said magnetic member; a plurality N of data output lines, where the number P of possible rotational positions of said member, and therefore of said switch apparatus, is given by $P=2^N$; and a diode array for connecting the outputs of said gates to the (N−1) least significant output lines, with the output of a selected one of said comparators being connected directly to the most significant bit data output line, to provide an N-bit digitally-coded output of that one of $2^N$ positions of said magnetic member with respect to said reference line.

2. The apparatus of claim 1 wherein P/2 comparators are utilized.

3. The apparatus of claim 1, wherein P/2 gates are utilized.

4. The apparatus of claim 1, wherein (P/2)-1 gates are utilized.

5. The apparatus of claim 1, wherein each of said differential-input, differential-output amplifiers includes first and second operational amplifiers each having an output, inverting input and non-inverting input; a first one of a pair of output lines of the associated sensor being connected directly to the first amplifier non-inverting input; a first resistance element connected between the remaining associated sensor output line and the first amplifier inverting input; a feedback resistance connected between the first amplifier output and the inverting input; a third resistance element connected between first amplifier output and the second amplifier inverting input; a fourth resistance element connected between the second amplifier non-inverting input and ground potential; and a fifth resistance element connected between the second amplifier inverting input and output; and a pair of differential outputs of opposite polarity, each respectively connected to the outputs of said first and second amplifiers, with respect to ground potential.

6. The apparatus of claim 1, wherein each of said sensors is a Hall-effect sensor having a first pair of inputs for receiving a current of substantially constant magnitude, and a pair of outputs at which appear a signal related to the product of the input current and the component of the magnetic member field parallel to the axis of that sensor.

7. The apparatus of claim 1, wherein said sensors and said digital data providing means are provided in a single integrated circuit.

8. The apparatus of claim 7, wherein said integrated circuit is adapted for mounting on a printed circuit board.

9. The apparatus of claim 7, further comprising a panel having a bushing portion; and a non-magnetic knob having said magnetic member enclosed in a portion thereof and adapted for rotation relative to said panel bushing portion.

* * * * *